US012598940B2

(12) United States Patent
Ono et al.

(10) Patent No.: US 12,598,940 B2
(45) Date of Patent: Apr. 7, 2026

(54) METHOD FOR MEASURING TEMPERATURE

(71) Applicant: SCREEN Holdings Co., Ltd., Kyoto (JP)

(72) Inventors: Yukio Ono, Kyoto (JP); Mao Omori, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 375 days.

(21) Appl. No.: 18/194,651

(22) Filed: Apr. 3, 2023

(65) Prior Publication Data

US 2023/0343616 A1 Oct. 26, 2023

(30) Foreign Application Priority Data

Apr. 26, 2022 (JP) ................................. 2022-072251

(51) Int. Cl.
| | |
|---|---|
| *H01L 21/67* | (2006.01) |
| *G01J 5/00* | (2022.01) |
| *G01J 5/80* | (2022.01) |

(52) U.S. Cl.
CPC ...... *H01L 21/67248* (2013.01); *G01J 5/0096* (2013.01); *G01J 5/806* (2022.01); *H01L 21/67115* (2013.01)

(58) Field of Classification Search
CPC ........ G01J 5/0007; G01J 5/0096; G01J 5/025; G01J 5/051; G01J 5/06; G01J 5/806; H01L 21/67115; H01L 21/67248
See application file for complete search history.

(56) References Cited

U.S. PATENT DOCUMENTS

| | | | | |
|---|---|---|---|---|
| 5,180,226 A | * | 1/1993 | Moslehi | ................ G01J 5/0804 |
| | | | | 250/339.04 |
| 5,660,472 A | * | 8/1997 | Peuse | ...................... G01J 5/041 |
| | | | | 374/126 |

(Continued)

FOREIGN PATENT DOCUMENTS

| | | |
|---|---|---|
| CN | 1754087 A | 3/2006 |
| JP | S59-60231 A | 4/1984 |

(Continued)

OTHER PUBLICATIONS

Request for the Submission of an Opinion dated Nov. 26, 2024 in corresponding Korean Patent Application No. 10-2023-0052585 and an English machine language translation obtained from the Global Dossier.

(Continued)

*Primary Examiner* — Kidest Worku

(74) *Attorney, Agent, or Firm* — OSTROLENK FABER LLP

(57) ABSTRACT

An edge radiation thermometer performs measurements before a semiconductor wafer is transported into a chamber. The edge radiation thermometer performs the measurements while the semiconductor wafer is supported by lift pins and while the semiconductor wafer is placed on a susceptor, after the semiconductor wafer is transported into the chamber. A controller calculates a reflectivity of the semiconductor wafer based on these measurement values. Then, the controller calculates an intensity of an ambient light receive by the edge radiation thermometer, based on the reflectivity and an intensity of synchrotron radiation radiated from a quartz window. Subsequently, the controller subtracts the intensity of the ambient light from an intensity of light received by of the edge radiation thermometer during heat treatment on the (Continued)

semiconductor wafer to calculate the temperature of the semiconductor wafer.

4 Claims, 9 Drawing Sheets

(56) References Cited

U.S. PATENT DOCUMENTS

| | | | |
|---|---|---|---|
| 5,830,277 A | 11/1998 | Johnsgard et al. | |
| 2001/0006530 A1* | 7/2001 | Adams .................. | G01J 5/0007 |
| | | | 374/127 |
| 2006/0100735 A1* | 5/2006 | Hauf ..................... | H01L 21/324 |
| | | | 700/121 |
| 2012/0201271 A1 | 8/2012 | Timans | |
| 2015/0023385 A1 | 1/2015 | Patalay et al. | |
| 2016/0109299 A1* | 4/2016 | Iyechika ................. | G01J 5/602 |
| | | | 374/126 |
| 2016/0282188 A1 | 9/2016 | Iyechika et al. | |
| 2018/0066364 A1* | 3/2018 | Rajagopalan ........... | H01L 21/00 |
| 2019/0141790 A1 | 5/2019 | Ito | |
| 2021/0057245 A1 | 2/2021 | Ueno et al. | |
| 2021/0272858 A1 | 9/2021 | Storek et al. | |

FOREIGN PATENT DOCUMENTS

| | | | |
|---|---|---|---|
| JP | H05-264356 A | 10/1993 | |
| JP | H11-329993 A | 11/1999 | |
| JP | 2001-249050 A | 9/2001 | |
| JP | 2002-148119 A | 5/2002 | |
| JP | 2006-512590 A | 4/2006 | |
| JP | 2017-009450 A | 1/2017 | |
| JP | 2019-087632 A | 6/2019 | |
| JP | 2019-168307 A | 10/2019 | |
| JP | 2021-034505 A | 3/2021 | |
| KR | 10-2016-0115856 A | 10/2016 | |
| TW | 202145471 A | 12/2021 | |

OTHER PUBLICATIONS

Notice of Opinion On Examination and Search Report dated Mar. 8, 2024 in corresponding Taiwanese Patent Application No. 112113282 and a machine generated translation thereof based on a Japanese translation of the Office Action.

Japanese Notice of Decision to Grant dated Aug. 26, 2025 in corresponding Japanese Patent Application No. 2022-072251.

* cited by examiner

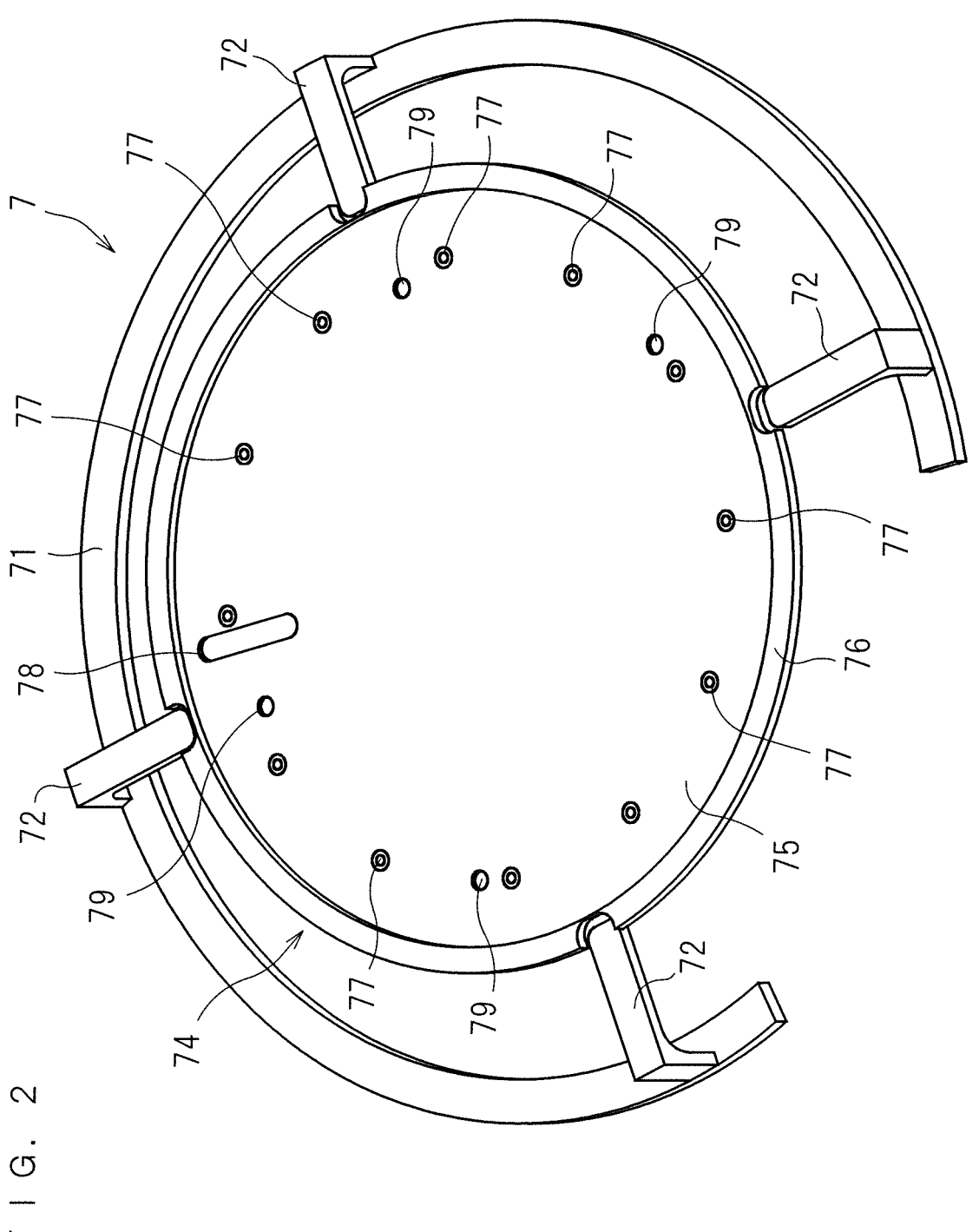
F I G. 2

F I G. 3
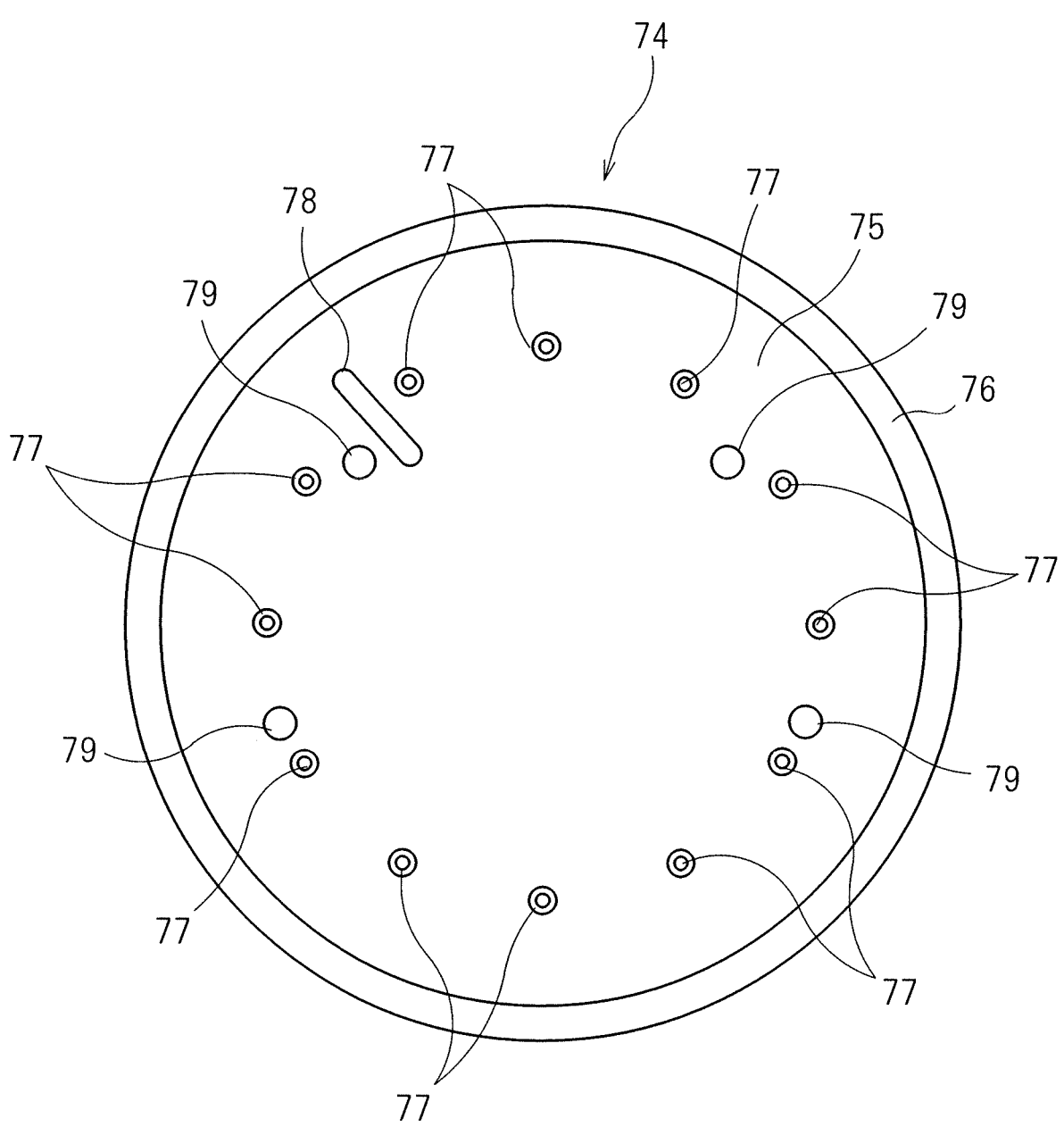

F I G   4
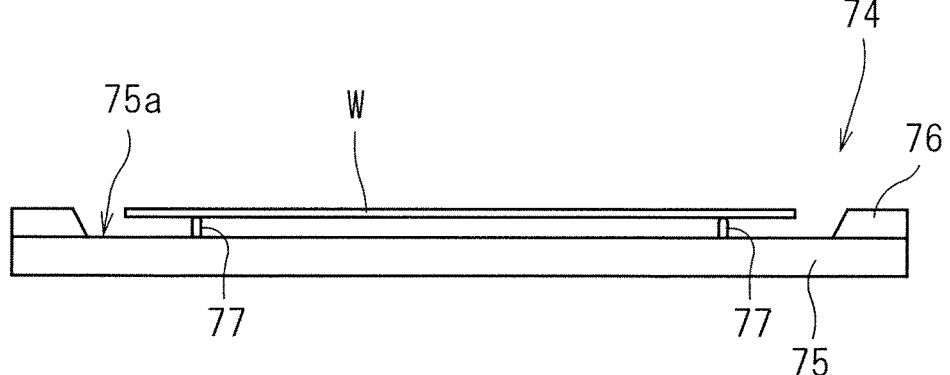
F I G .  5
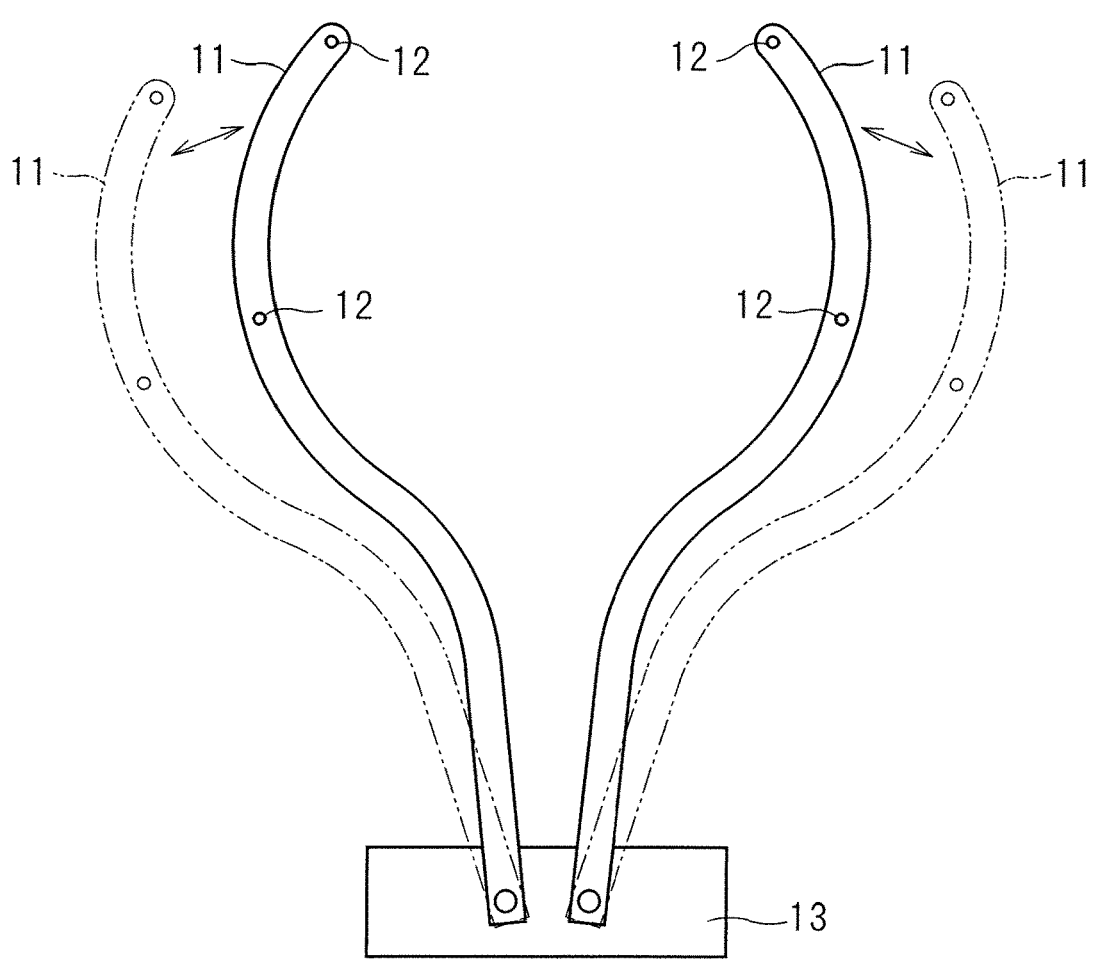

F I G .  6
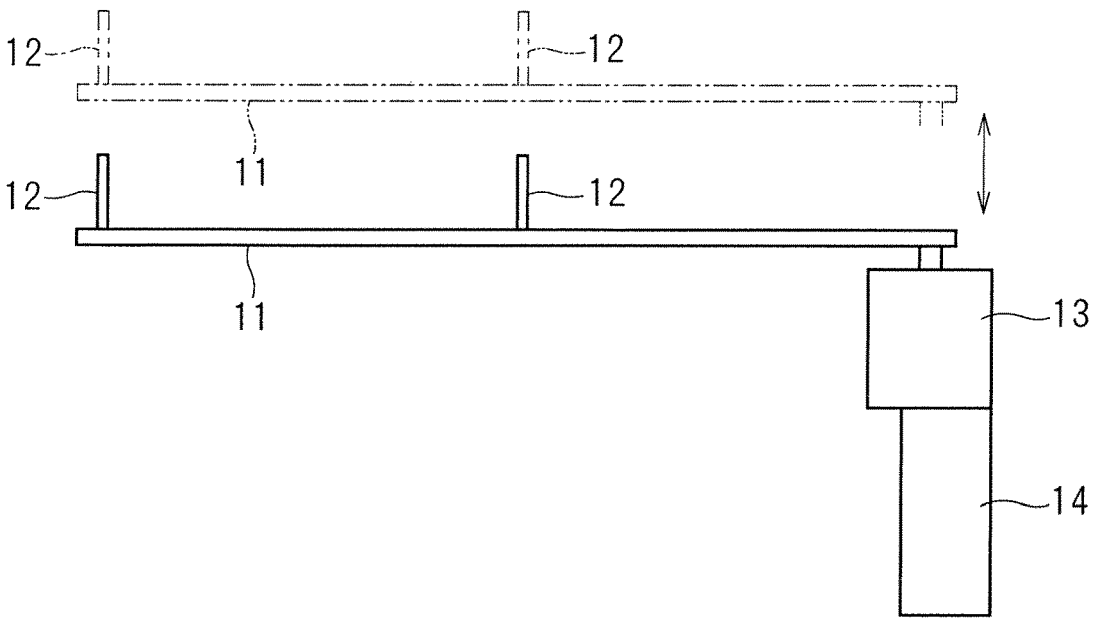
F I G .  7
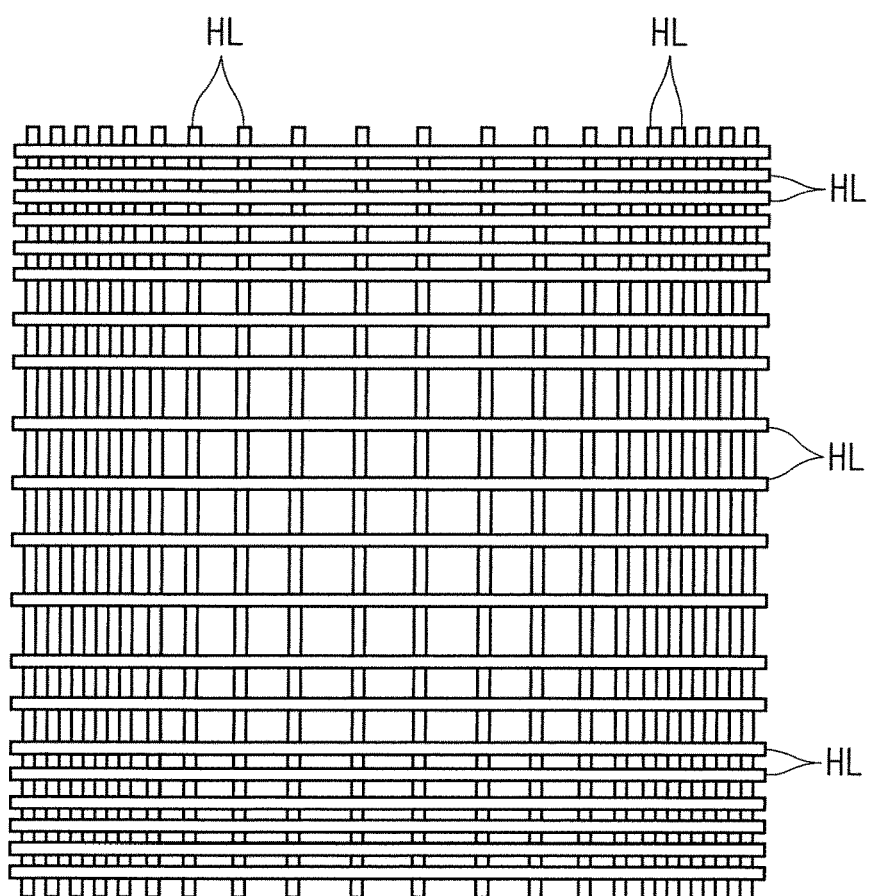

F I G. 8

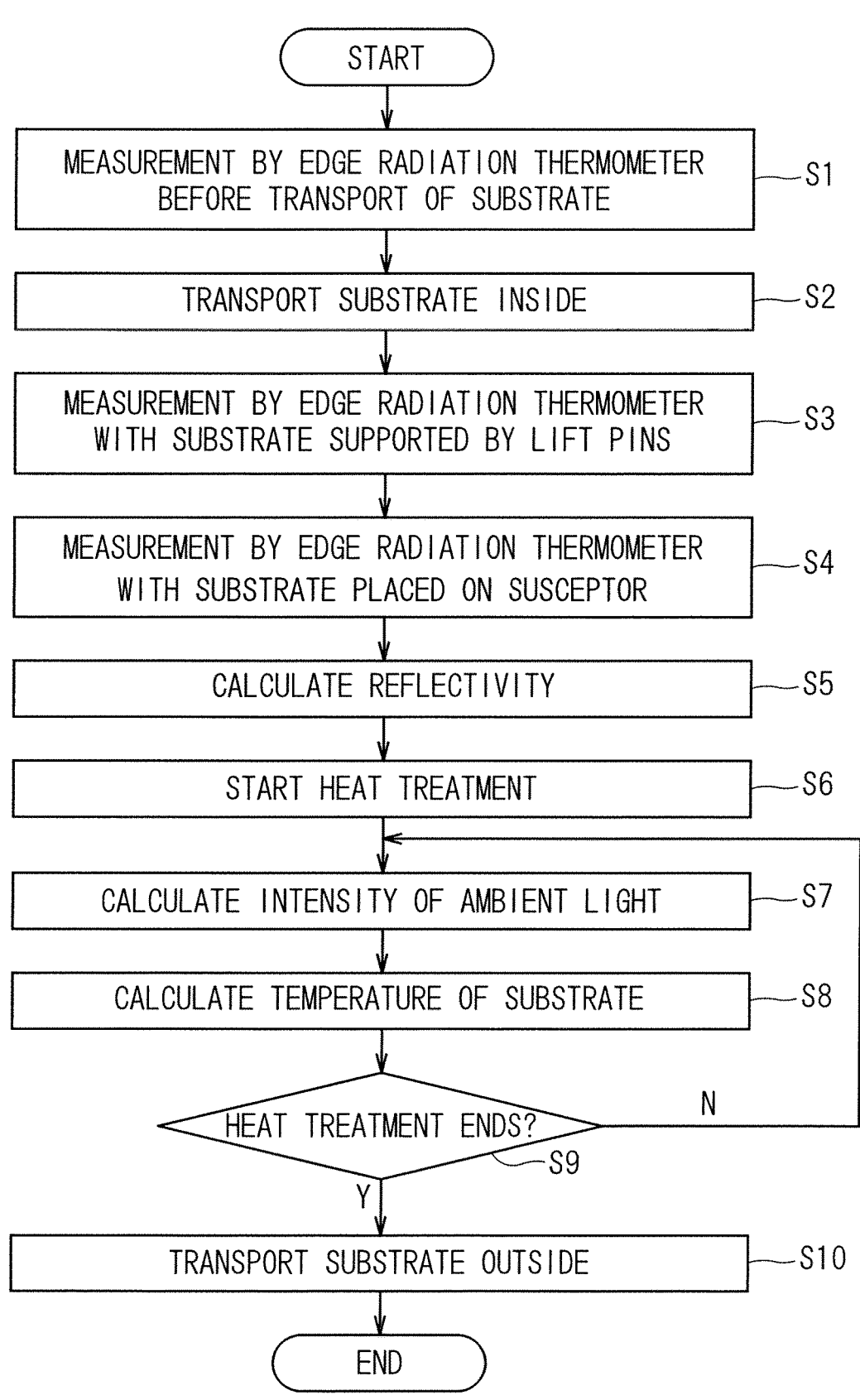

START

MEASUREMENT BY EDGE RADIATION THERMOMETER BEFORE TRANSPORT OF SUBSTRATE — S1

TRANSPORT SUBSTRATE INSIDE — S2

MEASUREMENT BY EDGE RADIATION THERMOMETER WITH SUBSTRATE SUPPORTED BY LIFT PINS — S3

MEASUREMENT BY EDGE RADIATION THERMOMETER WITH SUBSTRATE PLACED ON SUSCEPTOR — S4

CALCULATE REFLECTIVITY — S5

START HEAT TREATMENT — S6

CALCULATE INTENSITY OF AMBIENT LIGHT — S7

CALCULATE TEMPERATURE OF SUBSTRATE — S8

HEAT TREATMENT ENDS? — S9   N

Y

TRANSPORT SUBSTRATE OUTSIDE — S10

END

F I G. 9
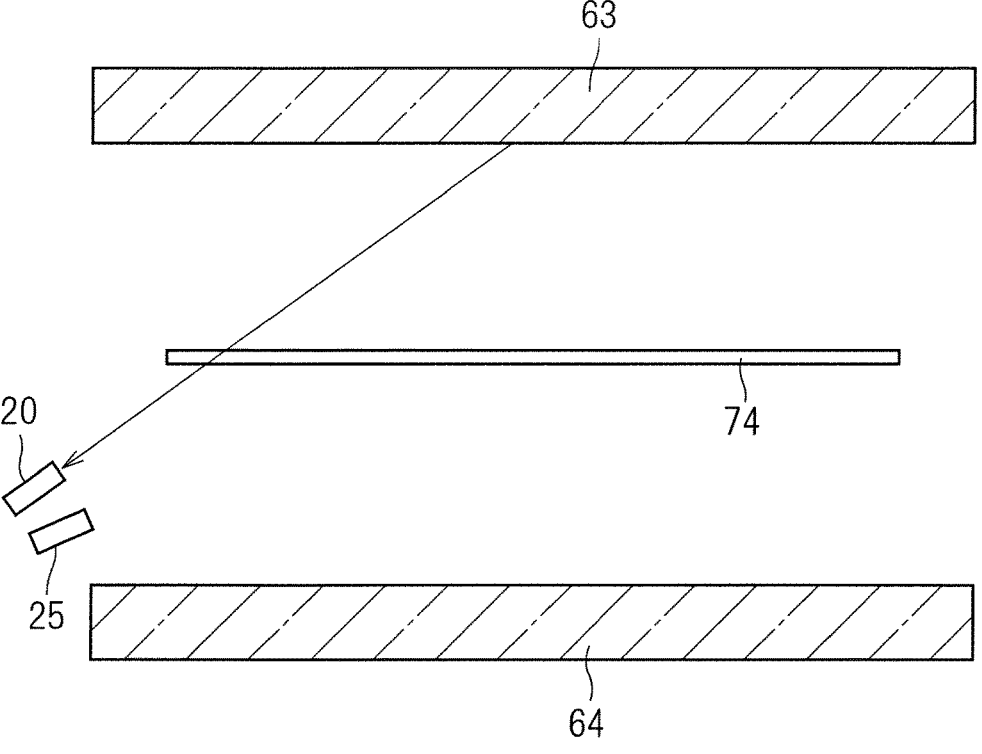
F I G. 1 0
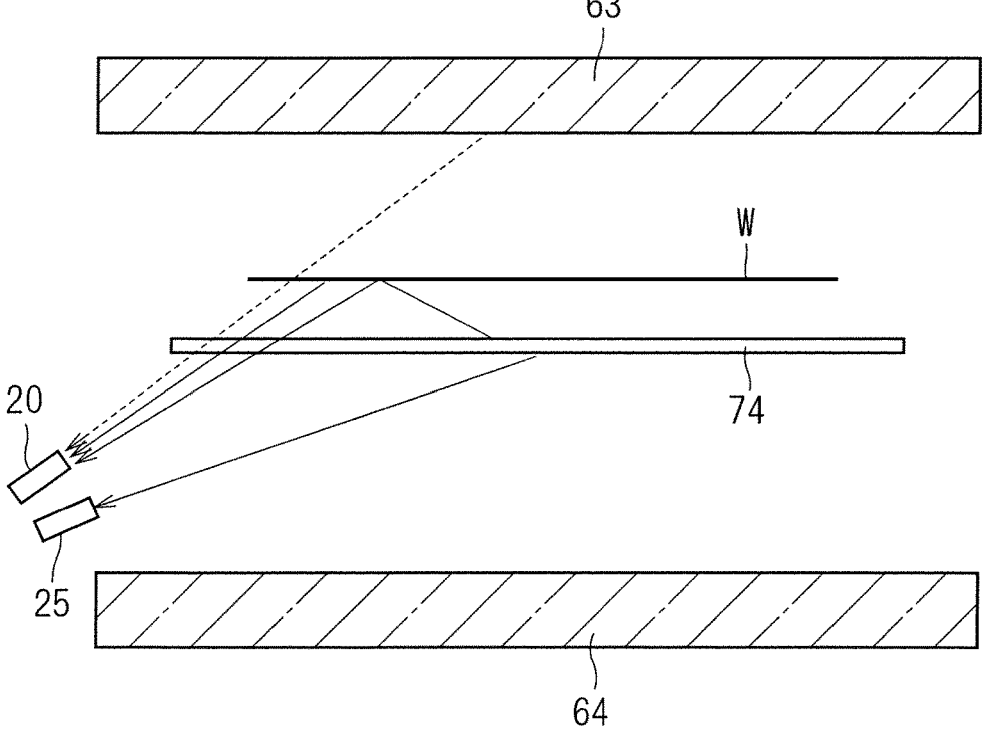

F I G. 1 1
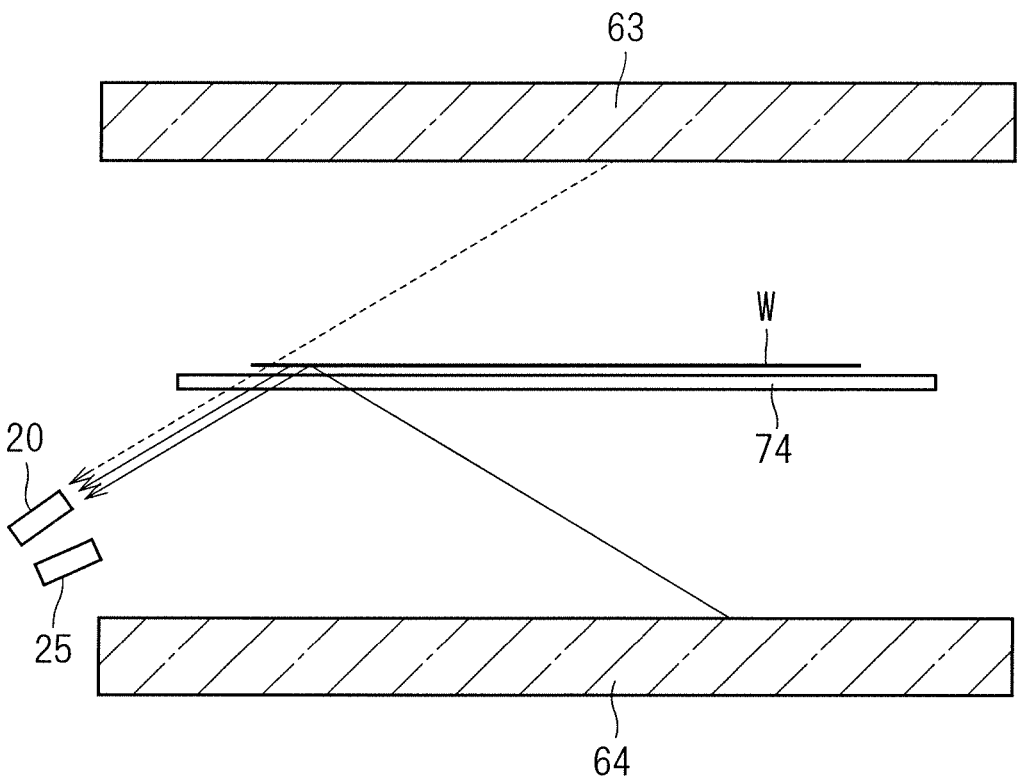

F I G . 1 2
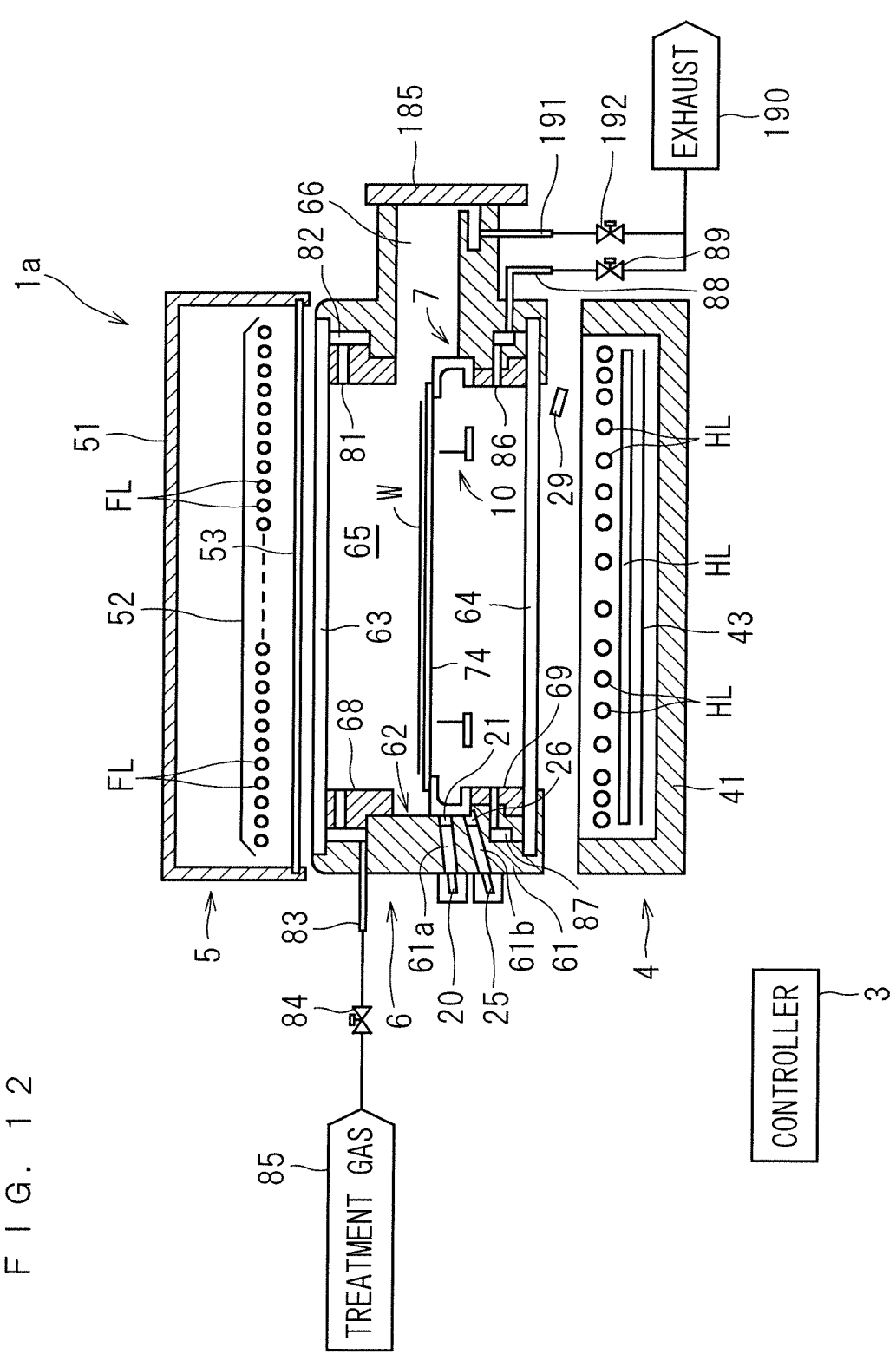

METHOD FOR MEASURING TEMPERATURE

BACKGROUND OF THE INVENTION

Field of the Invention

The present disclosure relates to a method for measuring a temperature of a substrate to be heated by light emission. Examples of the substrate to be treated include a semiconductor wafer, a substrate for liquid crystal display, a substrate for flat panel display (FPD), a substrate for optical disk, a substrate for magnetic disk, and a substrate for solar cell.

Description of the Background Art

In processes of manufacturing semiconductor devices, attention is being given to flash lamp annealing (FLA) for heating semiconductor wafers in a very short time period. The flash lamp annealing relates to a heat treatment technology for increasing the temperature of only a front surface of a semiconductor wafer in a very short time period (shorter than or equal to several milliseconds) by emitting a flash of light to the front surface using a xenon flash lamp (simply being referred to as "a flash lamp" will mean this xenon flash lamp hereinafter).

The spectral power distribution of xenon flash lamps ranges from the ultraviolet region to the near-infrared region. The light produced by the xenon flash lamps has wavelengths shorter than those of conventional halogen lamps, and almost coincides in fundamental absorption band with semiconductor wafers made of silicon. Thus, when the xenon flash lamp emits a flash of light to a semiconductor wafer, it can rapidly increase the temperature of the semiconductor wafer with less transmitted light. It turns out that temperatures of only the vicinity of the front surface of the semiconductor wafer can be selectively increased with emission of a flash of light in a very short time period less than or equal to several milliseconds.

This kind of flash lamp annealing is applied to treatment requiring heating for a very short time period, for example, typically to activation of impurities implanted into semiconductor wafers. When each flash lamp emits a flash of light to the front surface of the semiconductor wafer into which impurities have been implanted by an ion implantation method, the temperature of the front surface of the semiconductor wafer can be increased to an activation temperature for only a very short time period, which allows only activation of the impurities without deeply diffusing the impurities.

It is important to manage the temperature of a semiconductor wafer in not only the flash lamp annealing but also the heat treatment for the semiconductor wafer. Typically, a non-contact radiation thermometer measures the temperature of a semiconductor wafer during the heat treatment. Since the radiation thermometer receives not only infrared light radiated from the semiconductor wafer, but also infrared light radiated from a structure in a chamber such as a susceptor or a quartz window as an ambient light, an error occurs in measuring the temperature. Particularly, since the front surface and the back surface of a semiconductor wafer are mirror-finished surfaces, a ratio of a component of an ambient light reflected by the front surface or the back surface of the semiconductor wafer is relatively higher than that of a component of light emitted from the semiconductor wafer. Thus, the error when the radiation thermometer measures the temperature tends to increase. Thus, US2019/0141790 discloses a technology for correcting the temperature of a semiconductor wafer which has been measured by a radiation thermometer, based on the temperature of a quartz structure such as a susceptor or a quartz window.

However, the temperature of, for example, the quartz window constantly varies during the heat treatment of the semiconductor wafer. For example, when a halogen lamp is turned on to preheat the semiconductor wafer before emission of a flash of light, the temperature of the quartz window is increased. When the halogen lamp is turned off, the temperature of the quartz window is decreased. Thus, the intensity of an ambient light radiated from the quartz window and reflected by the front surface or the back surface of the semiconductor wafer constantly varies. Consequently, measuring the temperature in consideration of such variations in the ambient light has been sought.

SUMMARY

The present disclosure is directed to a method for measuring a temperature of a substrate to be heated by light emission.

According to one aspect of this disclosure, the method includes the steps of: (a) measuring a reflectivity of the substrate transported into a chamber; (b) calculating an intensity of an ambient light received by a radiation thermometer, based on the reflectivity measured in step (a) and an intensity of synchrotron radiation radiated from a quartz window included in the chamber, the radiation thermometer measuring the temperature of the substrate; and (c) subtracting the intensity of the ambient light from an intensity of light received by the radiation thermometer while the substrate is heated by the light emission to calculate the temperature of the substrate.

Consequently, this method can accurately calculate the intensity of the ambient light received by the radiation thermometer, and measure the temperature of the substrate with high precision.

Preferably, step (b) includes calculating the intensity of the ambient light, based on the intensity of the synchrotron radiation radiated from the quartz window that changes one after another while the substrate is heated by the light emission.

This method can calculate the intensity of the ambient light that changes one after another more appropriately and measure the temperature of the substrate more accurately.

Consequently, the object of this disclosure is to accurately calculate the intensity of the ambient light received by the radiation thermometer, and measure the temperature of the substrate with high precision.

These and other objects, features, aspects, and advantages of the present invention will become more apparent from the following detailed description of the present invention when taken in conjunction with the accompanying drawings.

BRIEF DESCRIPTION OF THE DRAWINGS

FIG. 2 is a perspective view showing the entire external appearance of a holder;

FIG. 3 is a plan view of a susceptor;

FIG. 4 is a sectional view of the susceptor;

FIG. 5 is a plan view of a transfer mechanism;

FIG. 6 is a side view of the transfer mechanism;

FIG. 7 is a plan view showing an arrangement of multiple halogen lamps;

FIG. 8 is a flowchart illustrating a procedure of treatment operations in the heat treatment apparatus;

FIG. 9 schematically illustrates a measurement by an edge radiation thermometer in the absence of a semiconductor wafer in a chamber;

FIG. 10 schematically illustrates a measurement by the edge radiation thermometer when the semiconductor wafer is supported by lift pins;

FIG. 11 schematically illustrates a measurement by the edge radiation thermometer when the semiconductor wafer is placed on a susceptor; and FIG. 12 is a longitudinal sectional view showing a structure of a heat treatment apparatus according to Embodiment 2.

DESCRIPTION OF THE PREFERRED EMBODIMENTS

Figure 1:
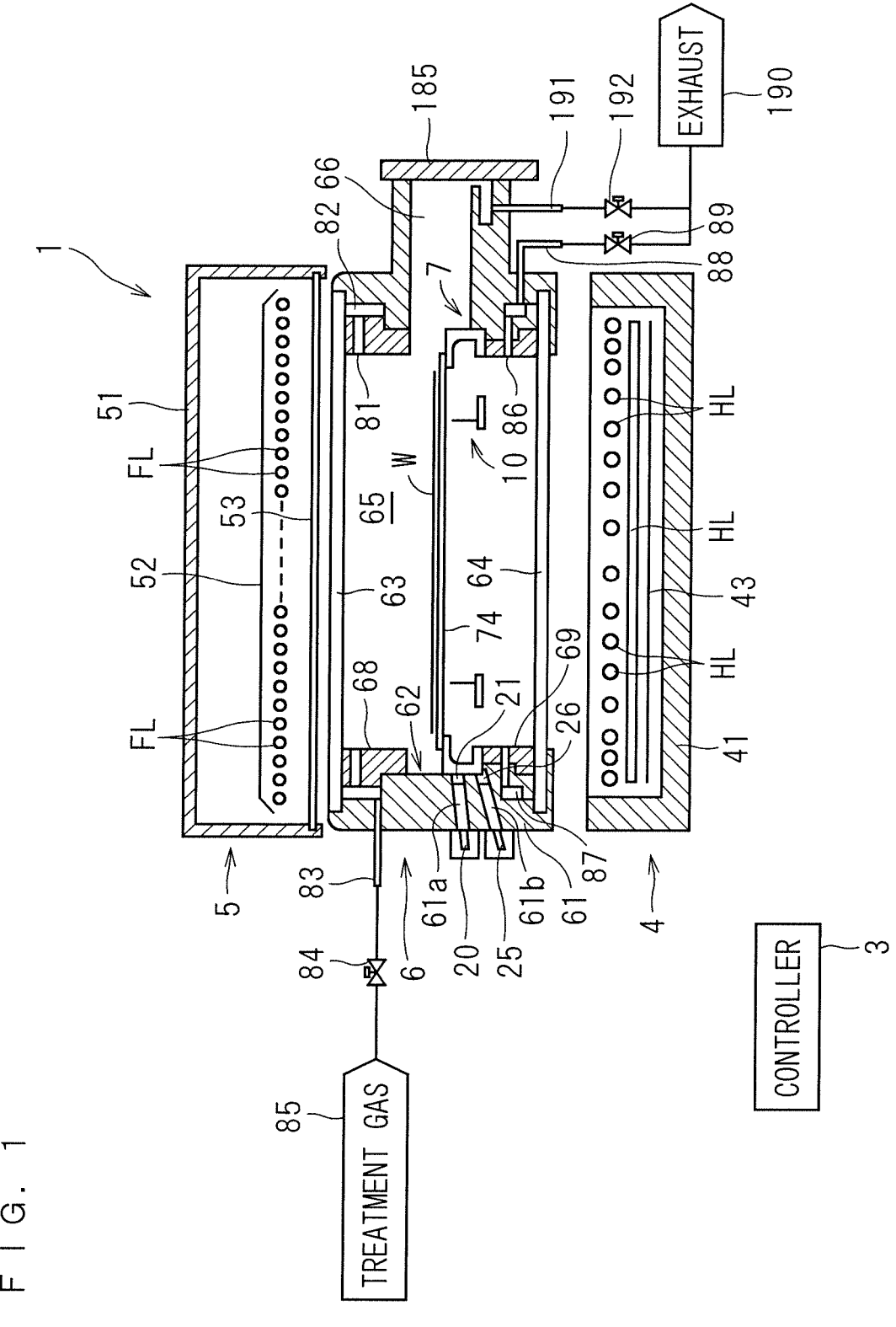
FIG. 1 is a longitudinal sectional view showing a structure of a heat treatment apparatus that performs a method for measuring a temperature according to the present disclosure.

Hereinafter, Embodiments of the present disclosure will be described in detail with reference to the drawings. Unless otherwise noted, the expressions indicating relative or absolute positional relationships (e.g., "in one direction", "along one direction", "parallel", "orthogonal", "central", "concentric", and "coaxial") include those exactly indicating the positional relationships and those where an angle or a distance is relatively changed within tolerance or to the extent that similar functions can be obtained. Unless otherwise noted, the expressions indicating equality (e.g., "same", "equal", "uniform", and "homogeneous") include those indicating quantitatively exact equality and those in the presence of a difference within tolerance or to the extent that similar functions can be obtained. Unless otherwise noted, the expressions indicating shapes (e.g., "circular", "rectangular" or "cylindrical") include those indicating geometrically exact shapes and those indicating, for example, roughness or a chamfer to the extent that similar advantages can be obtained. An expression "comprising", "including", "containing", or "having" a certain constituent element is not an exclusive expression for excluding the presence of the other constituent elements. An expression "at least one of A, B, and C" involves "only A", "only B", "only C", "arbitrary two of A, B, and C", and "all of A, B, and C".

Embodiment 1

FIG. 1 is a longitudinal sectional view showing a structure of a heat treatment apparatus 1 that performs a method for measuring a temperature according to the present disclosure. The heat treatment apparatus 1 in FIG. 1 is a flash lamp annealer that heats a disk-shaped semiconductor wafer W serving as a substrate by emitting a flash of light to the semiconductor wafer W. The size of the semiconductor wafer W to be treated is, but not particularly limited to, for example, 300 mm or 450 mm in diameter (300 mm in diameter in Embodiment 1). It should be noted that dimensions and the number of components in FIG. 1 and the subsequent figures are shown in exaggeration or in simplified form as appropriate for the sake of easier understanding.

The heat treatment apparatus 1 includes a chamber 6 that houses the semiconductor wafer W, a flash heater 5 including a plurality of flash lamps FL, and a halogen heater 4 including a plurality of halogen lamps HL. The flash heater 5 is provided above the chamber 6, and the halogen heater 4 is provided below the chamber 6. The heat treatment apparatus 1 also includes, within the chamber 6, a holder 7 that holds the semiconductor wafer W in a horizontal attitude, and a transfer mechanism 10 that transfers the semiconductor wafer W between the holder 7 and the outside of the apparatus. The heat treatment apparatus 1 further includes a controller 3 that controls operating mechanisms located in the halogen heater 4, the flash heater 5, and the chamber 6 for heat treatment of the semiconductor wafer W.

The chamber 6 includes quartz chamber windows attached to the top and the bottom of a chamber side portion 61 that is tubular. The chamber side portion 61 is substantially tubular with the top and the bottom opened. The top opening has a top chamber window 63 that is closed, and the bottom opening has a bottom chamber window 64 that is closed. The top chamber window 63, which is a ceiling portion of the chamber 6, is a disk-shaped part made of quartz, and functions as a quartz window that allows the flash of light emitted from the flash heater 5 to pass through the chamber 6. The bottom chamber window 64, which is a floor of the chamber 6, is also a disk-shaped part made of quartz, and functions as a quartz window that allows light emitted from the halogen heater 4 to pass through the chamber 6.

A reflection ring 68 is mounted on the upper portion of the inner wall surface of the chamber side portion 61, and a reflection ring 69 is mounted on the lower portion thereof. Both of the reflection rings 68 and 69 are formed annular. The upper reflection ring 68 is fitted from above the chamber side portion 61. On the other hand, the lower reflection ring 69 is fitted from below the chamber side portion 61 and fastened with screws that are not illustrated. In other words, the reflection rings 68 and 69 are both removably mounted on the chamber side portion 61. An interior space of the chamber 6, i.e., a space surrounded by the top chamber window 63, the bottom chamber window 64, the chamber side portion 61, and the reflection rings 68 and 69, is defined as a heat treatment space 65.

A recessed portion 62 is formed in the inner wall surface of the chamber 6 by fitting the reflection rings 68 and 69 to the chamber side portion 61. In other words, the recessed portion 62 is formed by being surrounded by a lower end face of the reflection ring 68, an upper end face of the reflection ring 69, and a central portion of the inner wall surface of the chamber side portion 61 to which the reflection rings 68 and 69 are not fitted. The recessed portion 62 is formed annular horizontally along the inner wall surface of the chamber 6, and surrounds the holder 7 that holds the semiconductor wafer W. The chamber side portion 61 and the reflection rings 68 and 69 are made of a metal material (e.g., stainless steel) superior in strength and heat resistance.

The chamber side portion 61 has a transport opening (throat) 66 through which the semiconductor wafer W is transported into and out of the chamber 6. The transport opening 66 is openable and closable with a gate valve 185. The transport opening 66 is connected in communication with an outer peripheral surface of the recessed portion 62. Thus, when the transport opening 66 is opened by the gate valve 185, the semiconductor wafer W can be transported into and out of the heat treatment space 65 through the transport opening 66 and the recessed portion 62. When the transport opening 66 is closed by the gate valve 185, the heat treatment space 65 in the chamber 6 is made airtight.

The chamber side portion 61 is further provided with a through hole 61*a* and a through hole 61*b* both bored therein. An edge radiation thermometer (edge pyrometer) 20 is attached to a portion on an external wall surface of the chamber side portion 61 in which the through hole 61*a* is bored. The through hole 61a is a cylindrical hole for directing the infrared light radiated from a lower surface of the semiconductor wafer W held by a susceptor 74 to be described later, to the edge radiation thermometer 20. A center radiation thermometer (center pyrometer) 25 is attached to a portion on the external wall surface of the chamber side portion 61 in which the through hole 61b is bored. The through hole 61b is a cylindrical hole for directing the infrared light radiated from the susceptor 74 to the center radiation thermometer 25. The through holes 61a and 61b are inclined with respect to a horizontal direction so that the longitudinal axes of the respective through holes 61a and 61b intersect with a main surface of the semiconductor wafer W held by the susceptor 74. Thus, the edge radiation thermometer 20 and the center radiation thermometer 25 are provided obliquely below the susceptor 74. A transparent window 21 and a transparent window 26 that are made of barium fluoride and allows infrared light to pass through in a wavelength range measurable with the edge radiation thermometer 20 and the center radiation thermometer 25 are mounted to end portions of the through hole 61a and the through hole 61b, respectively, which face the heat treatment space 65.

A gas supply opening 81 for supplying the heat treatment space 65 with a treatment gas is formed in an upper portion of the inner wall of the chamber 6. The gas supply opening 81 is formed above the recessed portion 62, and may be provided in the reflection ring 68. The gas supply opening 81 is connected in communication with a gas supply pipe 83 through a buffer space 82 formed annular inside the side wall of the chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows to be spread within the buffer space 82 lower in fluid resistance than the gas supply opening 81, and is supplied into the heat treatment space 65 through the gas supply opening 81. Examples of the treatment gas can include inert gases such as nitrogen ($N_2$), argon (Ar), and helium (He), reactive gases such as hydrogen ($H_2$) and ammonia ($NH_3$), and mixed gases that are mixtures of these gases.

A gas exhaust opening 86 for exhausting gas from the heat treatment space 65 is formed in a lower portion of the inner wall of the chamber 6. The gas exhaust opening 86 is formed below the recessed portion 62, and may be provided in the reflection ring 69. The gas exhaust opening 86 is connected in communication with a gas exhaust pipe 88 through a buffer space 87 formed annular inside the side wall of the chamber 6. The gas supply pipe 88 is connected to an exhaust part 190. A valve 89 is inserted at some midpoint in the gas exhaust pipe 88. When the valve 89 is opened, the gas in the heat treatment space 65 is exhausted to the gas exhaust pipe 88 through the gas exhaust opening 86 and the buffer space 87. The gas supply opening 81 and the gas exhaust opening 86 may be formed in a plurality of portions in a circumferential direction of the chamber 6, and may be slits. The treatment gas supply source 85 and the exhaust part 190 may be mechanisms provided in the heat treatment apparatus 1, or utility systems in a factory in which the heat treatment apparatus 1 is installed.

A gas exhaust pipe 191 for exhausting the gas from the heat treatment space 65 is also connected to an end of the transport opening 66. The gas exhaust pipe 191 is connected to the exhaust part 190 through a valve 192. By opening the valve 192, the gas in the chamber 6 is exhausted through the transport opening 66.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz part having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (see FIG. 1). The multiple coupling portions 72 (four coupling portions 72 in Embodiment 1) are mounted upright on the upper surface of the base ring 71 and arranged in a circumferential direction of the annular shape thereof. The coupling portions 72 are quartz parts, and are rigidly secured to the base ring 71 by welding.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a roughly circular and planar part made of quartz. The diameter of the holding plate 75 is greater than that of the semiconductor wafer W. In other words, the holding plate 75 is greater in plan size than the semiconductor wafer W.

The guide ring 76 is provided on a peripheral portion of the upper surface of the holding plate 75. The guide ring 76 is an annular part having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is a tapered surface which becomes wider upward from the holding plate 75. The guide ring 76 is made of quartz similar to that of the holding plate 75. The guide ring 76 may be welded to the upper surface of the holding plate 75 or fixed to the holding plate 75 with, for example, separately machined pins. Alternatively, the holding plate 75 and the guide ring 76 may be machined as an integral part.

A region of the upper surface of the holding plate 75 which is inside the guide ring 76 serves as a planar holding surface 75a for holding the semiconductor wafer W. The plurality of substrate support pins 77 are mounted upright on the holding surface 75a of the holding plate 75. In Embodiment 1, a total of 12 substrate support pins 77 are mounted upright at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (270 mm in Embodiment 1) when the diameter of the semiconductor wafer W is 300 mm. Each of the substrate support pins 77 is made of quartz. The substrate support pins 77 may be welded on the upper surface of the holding plate 75, or machined integrally with the holding plate 75.

Referring again to FIG. 2, the four coupling portions 72 mounted upright on the base ring 71 are rigidly secured to the peripheral portion of the holding plate 75 of the susceptor 74 by welding. In other words, the susceptor 74 and the base ring 71 are fixedly coupled to each other with the coupling portions 72. The base ring 71 of the holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the susceptor 74 coincides with a vertical direction). In other words, the holding surface 75a of the holding plate 75 becomes a horizontal surface.

The semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 mounted upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W can be supported in a horizontal attitude by the 12 substrate support pins 77 because the 12 substrate support pins 77 have a uniform height (a distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is formed in the holding plate 75 of the susceptor 74 so as to extend vertically through the holding plate 75. The opening 78 is provided for the edge radiation thermometer 20 to receive synchrotron radiation (infrared light) radiated from the lower surface of the semiconductor wafer W. Specifically, the edge radiation thermometer 20 receives the light radiated from the lower surface of the semiconductor wafer W through the opening 78 and the transparent window 21 mounted to the through hole 61a to measure the temperature of the semiconductor wafer W. Further, the holding plate 75 of the susceptor 74 further includes four through holes 79 through which lift pins 12 of the transfer mechanism 10 to be described later pass to transfer the semiconductor wafer W.

FIG. 5 is a plan view of the transfer mechanism 10. FIG. 6 is a side view of the transfer mechanism 10. The transfer mechanism 10 includes the two transfer arms 11. The transfer arms 11 have an arcuate shape to fit the recessed portion 62 that is roughly annular. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 horizontally moves the pair of transfer arms 11 between a transfer operation position (a position indicated by solid lines in FIG. 5) in which the semiconductor wafer W is transferred to and from the holder 7 and a retracted position (a position indicated by dash-double-dot lines in FIG. 5) in which the transfer arms 11 do not overlap the semiconductor wafer W held by the holder 7 in a plan view. The horizontal movement mechanism 13 may cause individual motors to pivot the respective transfer arms 11. Alternatively, a linkage mechanism may cause a single motor to pivot the pair of transfer arms 11 in a cooperative manner.

The pair of transfer arms 11 is moved upward and downward by an elevating mechanism 14 together with the horizontal movement mechanism 13. When the elevating mechanism 14 moves up the pair of transfer arms 11 at the transfer operation position, the four lift pins 12 in total pass through the respective four through holes 79 (see FIGS. 2 and 3) bored in the susceptor 74 so that the upper ends of the lift pins 12 protrude from the upper surface of the susceptor 74. On the other hand, when the elevating mechanism 14 moves down the pair of transfer arms 11 at their transfer operation position to take the lift pins 12 out of the respective through holes 79 and the horizontal movement mechanism 13 moves the pair of transfer arms 11 to be opened, the pair of the transfer arms 11 moves to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not illustrated is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heater 5 provided over the chamber 6 includes, inside an enclosure 51, a light source including the multiple (30 in Embodiment 1) xenon flash lamps FL, and a reflector 52 to cover the upper portion of the light source. The flash heater 5 further includes a lamp light radiation window 53 mounted to the bottom of the enclosure 51. The lamp light radiation window 53 forming the floor of the flash heater 5 is a plate-like quartz window made of quartz. The flash heater 5 is provided over the chamber 6, whereby the lamp light radiation window 53 is opposed to the top chamber window 63. The flash lamps FL emit flashes of light to the heat treatment space 65 from over the chamber 6 through the lamp light radiation window 53 and the top chamber window 63.

The plurality of flash lamps FL, each of which is a rod-shaped lamp having an elongated cylindrical shape, are arranged in a plane so that the longitudinal directions of the respective flash lamps FL are in parallel with each other along the main surface of the semiconductor wafer W held by the holder 7 (that is, in a horizontal direction). Thus, a plane defined by the arrangement of the flash lamps FL is also a horizontal plane.

The xenon flash lamp FL includes a rod-shaped glass tube (discharge tube) containing xenon gas sealed therein and having positive and negative electrodes on opposite ends thereof that are connected to a capacitor, and a trigger electrode attached to the outer peripheral surface of the glass tube. Even if charges are accumulated on the capacitor, no electricity will flow through the glass tube in a normal state because the xenon gas is an electrical insulator. However, when a high voltage is applied to the trigger electrode to cause an electrical breakdown, the electricity accumulated in the capacitor momentarily flows through the glass tube, so that excitation of xenon atoms or molecules at this time causes light to be emitted. Since the electrostatic energy accumulated in advance in the capacitor of the xenon flash lamp FL is transformed into very short light pulses ranging from 0.1 to 100 milliseconds, the xenon flash lamp FL is characterized by having the possibility of emitting more intense light than that of a continuous lighting light source such as the halogen lamps HL. In other words, the xenon flash lamp FL is a pulse emitting lamp that momentarily emits light in a very short time period less than one second. The light emission time of the flash lamps FL can be adjusted by a coil constant of a lamp light source that supplies power to the flash lamps FL.

The reflector 52 is provided over the plurality of flash lamps FL to cover all of the flash lamps FL. The basic function of the reflector 52 is to reflect the flash of light emitted from the plurality of flash lamps FL to the heat treatment space 65 side. The reflector 52 is a plate made of an aluminum alloy. A surface of the reflector 52 (a surface which faces the flash lamps FL) is roughened by abrasive blasting.

The halogen heater 4 provided under the chamber 6 includes, inside an enclosure 41, the multiple (40 in Embodiment 1) halogen lamps HL. The halogen heater 4 emits light to the heat treatment space 65 from under the chamber 6 through the bottom chamber window 64 to heat the semiconductor wafer W by means of the halogen lamps HL.

FIG. 7 is a plan view showing an arrangement of the multiple halogen lamps HL. The 40 halogen lamps HL are arranged in two tiers, i.e., upper and lower tiers. Specifically, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper tier and the lower tier are arranged so that the longitudinal directions thereof are in parallel with each other along the main surface of the semiconductor wafer W held by the holder 7 (that is, in a horizontal direction). Thus, a plane defined by the arrangement of the halogen lamps HL in each of the upper and lower tiers is a horizontal plane.

As shown in FIG. 7, the halogen lamps HL in each of the upper and lower tiers are disposed at a higher density in regions facing the peripheral portion of the semiconductor wafer W held by the holder 7 than in a region facing the central portion thereof. In other words, the halogen lamps HL in each of the upper and lower tiers are arranged at shorter intervals in the peripheral portions of the lamp arrangement than in the central portion thereof. When the semiconductor wafer W is heated by the halogen heater 4 through light emission, a greater amount of light can impinge upon the peripheral portion of the semiconductor wafer W subject to a temperature decrease.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (e.g., iodine or bromine) in trace amounts into an inert gas such as nitrogen or argon is sealed in the glass tube. The introduction of the halogen element allows the temperature of the filament to be set at a high temperature while suppressing a break in the filament. Thus, the halogen lamps HL are characterized by having a longer life than typical incandescent lamps and being capable of continuously emitting intense light. In other words, the halogen lamps HL are continuous lighting lamps that emit light continuously for not less than one second. In addition, the halogen lamps HL, which are rod-shaped lamps, have a long life. The arrangement of the halogen lamps HL in a horizontal direction exhibits superior radiation efficiency toward the semiconductor wafer W provided over the halogen lamps HL.

A reflector 43 is provided also inside the enclosure 41 of the halogen heater 4 under the halogen lamps HL arranged in two tiers (FIG. 1). The reflector 43 reflects the light emitted from the plurality of halogen lamps HL toward the heat treatment space 65.

As illustrated in FIG. 1, the chamber 6 includes two radiation thermometers of the edge radiation thermometer 20 and the center radiation thermometer 25. Both of the edge radiation thermometer 20 and the center radiation thermometer 25 are disposed below the semiconductor wafer W held by the susceptor 74. The edge radiation thermometer 20 measures the temperature of the lower surface of the semiconductor wafer W by receiving the infrared light radiated from the lower surface of the semiconductor wafer W through the opening 78 that is a cutout portion formed on the susceptor 74. In other words, a region measured by the edge radiation thermometer 20 is inside the opening 78. In addition, a region measured by the center radiation thermometer 25 is in a plane of the holding plate 75 of the susceptor 74. The center radiation thermometer 25 measures the temperature of the susceptor 74 by receiving the infrared light radiated from the susceptor 74.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program, a RAM or readable/writable memory for storing various pieces of information, and a storage (e.g., a magnetic disk) for storing, for example, control software and data. The CPU in the controller 3 executes a predetermined processing program, so that the processes in the heat treatment apparatus 1 proceed. The controller 3 also performs various computation processes based on measurement values of the edge radiation thermometer 20 and the center radiation thermometer 25.

The heat treatment apparatus 1 further includes, in addition to the aforementioned components, various cooling structures to prevent an excessive temperature rise in the halogen heater 4, the flash heater 5, and the chamber 6 due to the heat energy generated from the halogen lamps HL and the flash lamps FL during the heat treatment of the semiconductor wafer W. For example, a water-cooling tube (not illustrated) is provided in the walls of the chamber 6. Also, the halogen heater 4 and the flash heater 5 have an air cooling structure for generating a gas flow therein to exhaust heat. Air is supplied to a gap between the top chamber window 63 and the lamp light radiation window 53 to cool down the flash heater 5 and the top chamber window 63.

Next, treatment operations in the heat treatment apparatus 1 with the aforementioned structures will be described. FIG. 8 is a flowchart illustrating a procedure of the treatment operations in the heat treatment apparatus 1. The controller 3 controls the operating mechanisms provided in the heat treatment apparatus 1, so that the operating procedure in the heat treatment apparatus 1 to be described later will proceed.

In the heat treatment apparatus 1, a plurality of semiconductor wafers W of one lot are transported sequentially one by one into the chamber 6 to be subjected to the heat treatment. During the sequential heat treatment of the plurality of semiconductor wafers W, the temperatures of structures in the chamber 6 such as the top chamber window 63, the bottom chamber window 64, and the susceptor 74 are increased due to absorption of the light emitted from the halogen lamps HL and the flash lamps FL, the thermal convection of the heat, and the conductivity of the heat from the semiconductor wafer W. For example, when the plurality of semiconductor wafers W are stably treated, the tempera- tures of the top chamber window 63 and the bottom chamber window 64 are increased to approximately 20° C. to 500° C. Thereby, the edge radiation thermometer 20 and the center radiation thermometer 25 receive the synchrotron radiation radiated from the structures in the chamber 6 whose tem- peratures have been increased. Thus, the edge radiation thermometer 20 and the center radiation thermometer 25 constantly continue to output the measurement values.

In Embodiment 1, the edge radiation thermometer 20 performs a measurement immediately before the semicon- ductor wafer W is transported into the chamber 6 (Step S1). FIG. 9 schematically illustrates the measurement by the edge radiation thermometer 20 in the absence of the semi- conductor wafer W in the chamber 6. Before the semicon- ductor wafer W is transported into the chamber 6, that is, in the absence of the semiconductor wafer W in the chamber 6, the edge radiation thermometer 20 receives the synchrotron radiation radiated from the top chamber window 63 through the opening 78 of the susceptor 74. Since the region mea- sured by the edge radiation thermometer 20 is inside the opening 78, the edge radiation thermometer 20 does not receive the synchrotron radiation radiated from the susceptor 74. Furthermore, the edge radiation thermometer 20 does not receive the synchrotron radiation radiated from the bottom chamber window 64. Thus, the edge radiation thermometer 20 substantially receives only the synchrotron radiation radiated from the top chamber window 63 in the absence of the semiconductor wafer W in the chamber 6. Equation (1) below expresses a measurement value Ip1 output from the edge radiation thermometer 20 immediately before the semi- conductor wafer W is transported into the chamber 6.

$$Ip1 = Iuw \ldots \tag{1}$$

In Equation (1), Iuw denotes an intensity of the synchro- tron radiation radiated from the top chamber window 63. Each of the edge radiation thermometer 20 and the center radiation thermometer 25 is a sensor that measures a tem- perature of an object to be measured. Strictly speaking, a measurement value directly output by each of the radiation thermometers is a value indicating an intensity of light received by the radiation thermometer. The controller 3 performs a computation process for converting the intensity value into a temperature to find the temperature of the object to be measured.

After the edge radiation thermometer 20 performs a measurement, the semiconductor wafer W to be treated is transported into the chamber 6 (Step S2). Prior to transport of the semiconductor wafer W, the valve 84 for supply of gas is opened, and the valves 89 and 192 for exhaust of gas are opened, so that the supply and exhaust of gas into and out of the chamber 6 start. When the valve 84 is opened, nitrogen gas is supplied into the heat treatment space 65 through the gas supply opening 81. When the valve 89 is opened, the gas within the chamber 6 is exhausted through the gas exhaust opening 86. This causes the nitrogen gas supplied from an upper portion of the heat treatment space 65 in the chamber 6 to flow downward and then to be exhausted from a lower portion of the heat treatment space 65.

The gas within the chamber 6 is exhausted also through the transport opening 66 by opening the valve 192. Further, the exhaust mechanism not illustrated exhausts an atmosphere near the drivers of the transfer mechanism 10. The nitrogen gas is continuously supplied into the heat treatment space 65 during the heat treatment of the semiconductor wafer W in the heat treatment apparatus 1. The amount of nitrogen gas supplied into the heat treatment space 65 is changed as appropriate in accordance with process steps.

Subsequently, the gate valve 185 is opened to open the transport opening 66. A transport robot outside the heat treatment apparatus 1 transports the semiconductor wafer W to be treated into the heat treatment space 65 of the chamber 6 through the transport opening 66. At this time, there is a danger that an atmosphere outside the heat treatment appa- ratus 1 is carried as the semiconductor wafer W is trans- ported. However, the nitrogen gas is continuously supplied into the chamber 6. Thus, the nitrogen gas flows out of the transport opening 66 to minimize the carried outside atmo- sphere.

The semiconductor wafer W transported by the transport robot is moved forward to a position lying immediately over the holder 7 and is stopped. Then, the pair of transfer arms 11 of the transfer mechanism 10 is moved horizontally from the retracted position to the transfer operation position and is then moved upward, whereby the lift pins 12 pass through the through holes 79 and protrude from the upper surface of the holding plate 75 of the susceptor 74 to receive the semiconductor wafer W. At this time, the lift pins 12 move upward above the upper ends of the substrate support pins 77. After the semiconductor wafer W is supported by the lift pins 12, the transport robot moves out of the heat treatment space 65, and the gate valve 185 closes the transport opening 66.

Next, the edge radiation thermometer 20 performs a measurement while the semiconductor wafer W is supported by the lift pins 12 (Step S3). FIG. 10 schematically illus- trates the measurement by the edge radiation thermometer 20 when the semiconductor wafer W is supported by the lift pins 12. While the semiconductor wafer W is supported by the lift pins 12, the semiconductor wafer W is held at an upper position spaced above the susceptor 74. Thus, there is a relatively great distance between the semiconductor wafer W and the susceptor 74.

When the semiconductor wafer W is supported by the lift pins 12 apart from the susceptor 74, the edge radiation thermometer 20 receives transmitted light radiated from the top chamber window 63 and transmitted through the semi- conductor wafer W, synchrotron radiation directly radiated from the semiconductor wafer W, and reflected light radiated from the susceptor 74 and reflected off the back surface of the semiconductor wafer W. The edge radiation thermometer 20 receives these through the opening 78 of the susceptor 74. Equation (2) below expresses a measurement value Ip2 output from the edge radiation thermometer 20 when the semiconductor wafer W is supported by the lift pins 12. The measurement value Ip2 indicates an intensity of light received by the edge radiation thermometer 20 when the semiconductor wafer W is supported by the lift pins 12.

$$Ip2 = tw \cdot Iuw + rw \cdot Is + Iw \ldots \tag{2}$$

In Equation (2), tw and rw denote a transmissivity and a reflectivity of the semiconductor wafer W, respectively. Furthermore, Is denotes an intensity of synchrotron radiation radiated from the susceptor 74. Furthermore, Iw denotes an intensity of synchrotron radiation radiated from the semi- conductor wafer W. The temperature of the semiconductor wafer W when the semiconductor wafer W is transported into the chamber 6 is approximately a room temperature. Thus, the intensity Iw of the synchrotron radiation radiated from the semiconductor wafer W can be 0. Consequently, Equation (3) holds for Equations (1) and (2).

$$Ip2 = tw \cdot Ip1 + rw \cdot Is \ldots \tag{3}$$

Then, the pair of transfer arms 11 of the transfer mechanism 10 moves downward to disengage the lift pins 12 from the through holes 79 downward. This transfers the semiconductor wafer W from the transfer mechanism 10 to the susceptor 74, so that the semiconductor wafer W is held in a horizontal attitude from below. The semiconductor wafer W is supported by the plurality of substrate support pins 77 mounted upright on the holding plate 75, and is held by the susceptor 74. The semiconductor wafer W is placed on the susceptor 74, assuming that a front surface on which the semiconductor wafer W is treated is the upper surface. The pair of transfer arms 11 moved downward below the susceptor 74 is moved back to the retracted position, i.e., to the inside of the recessed portion 62, by the horizontal movement mechanism 13. Then, the edge radiation thermometer 20 performs a measurement again while the semiconductor wafer W is placed on the susceptor 74 (Step S4).

FIG. 11 schematically illustrates the measurement by the edge radiation thermometer 20 when the semiconductor wafer W is placed on the susceptor 74. While the semiconductor wafer W is placed on the susceptor 74, the semiconductor wafer W is held at a lower position in the proximity of the susceptor 74. The distance between the semiconductor wafer W and the holding surface 75a of the susceptor 74 is as short as a heigh of the substrate support pin 77.

When the semiconductor wafer W is placed on the susceptor 74, the edge radiation thermometer 20 receives the transmitted light radiated from the top chamber window 63 and transmitted through the semiconductor wafer W, the synchrotron radiation directly radiated from the semiconductor wafer W, and reflected light radiated from the bottom chamber window 64 and reflected off the back surface of the semiconductor wafer W. When the semiconductor wafer W is placed on the susceptor 74, there is little distance between the semiconductor wafer W and the susceptor 74. Thus, there is no reflected light which is radiated from the susceptor 74, reflected off the back surface of the semiconductor wafer W, passes through the opening 78, and is received by the edge radiation thermometer 20. In contrast, a reflected light occurs which is radiated from the bottom chamber window 64, passes through the opening 78, reflected off the back surface of the semiconductor wafer W, passes through the opening 78 again, and is received by the edge radiation thermometer 20. Equation (4) below expresses a measurement value Ip3 output from the edge radiation thermometer 20 when the semiconductor wafer W is placed on the susceptor 74. The measurement value Ip3 indicates an intensity of light received by the edge radiation thermometer 20 when the semiconductor wafer W is placed on the susceptor 74.

$$Ip3 = tw \cdot Iuw + rw \cdot Ilw + Iw \ldots \tag{4}$$

In Equation (4), Ilw denotes an intensity of synchrotron radiation radiated from the bottom chamber window 64. As described above, the temperature of the semiconductor wafer W immediately after the semiconductor wafer W is placed on the susceptor 74 is approximately a room temperature. Thus, the intensity Iw of the synchrotron radiation radiated from the semiconductor wafer W can be 0. Consequently, Equation (5) holds for Equations (1) and (4).

$$Ip3 = tw \cdot Ip1 + rw \cdot Ilw \ldots \tag{5}$$

Equation (6) holds by subtracting Equation (3) from Equation (5). Then, Equation (7) is derived from Equation (6).

$$Ip3 - Ip2 = rw \cdot Ilw - rw \cdot Is \tag{6}$$

$$rw = \frac{Ip3 - Ip2}{Ilw - Is} \tag{7}$$

The measurement value Ip2 and the measurement value Ip3 in Equation (7) are actual measured values of the edge radiation thermometer 20 while the semiconductor wafer W is supported by the lift pins 12 and while the semiconductor wafer W is placed on the susceptor 74, respectively. Furthermore, the center radiation thermometer 25 directly receives the synchrotron radiation radiated from the susceptor 74 (see FIG. 10). Specifically, the intensity Is of the synchrotron radiation radiated from the susceptor 74 is an actual measured values of the center radiation thermometer 25. Thus, if the intensity Ilw of the synchrotron radiation radiated from the bottom chamber window 64 can be found, a reflectivity of the back surface of the semiconductor wafer W in the chamber 6 can be calculated from Equation (7).

The intensity Ilw of the synchrotron radiation radiated from the bottom chamber window 64 is represented as a function of the temperature of the bottom chamber window 64. The temperature of the bottom chamber window 64 is increased by absorbing a part of light emitted from the halogen lamps HL. Thus, the temperature of the bottom chamber window 64 mainly depends on the lamp power of the halogen lamps HL. Thus, before the semiconductor wafer W is treated in Embodiment 1, a mathematical model such as a transfer function representing a relationship between the lamp power of the plurality of halogen lamps HL and the intensity Ilw of the synchrotron radiation radiated from the bottom chamber window 64 is built in advance. Specifically, for example, a contact thermometer such as a thermocouple is temporarily attached to the bottom chamber window 64. The contact thermometer measures the temperature of the bottom chamber window 64 while the halogen lamps HL are turned on to vary the lamp power. Then, for example, the controller 3 identifies a relationship between the lamp power that changes in time and the temperature measurement value. For example, the controller 3 synthesizes the relationship with the function of the temperature of the bottom chamber window 64 as the intensity Ilw of the synchrotron radiation radiated from the bottom chamber window 64 to create a mathematical model such as a transfer function.

The controller 3 gives the mathematical model the intensity of the synchrotron radiation radiated from the bottom chamber window 64 at a room temperature as an initial value (Ilw0), and also substitutes, in the mathematical model, the lamp power of the halogen lamps HL that changes in time to estimate the intensity Ilw of the synchrotron radiation which has been radiated from the bottom chamber window 64 and changes one after another. Then, the controller 3 finds, from the mathematical model, the intensity Ilw of the synchrotron radiation radiated from the bottom chamber window 64 when the semiconductor wafer W is transported into the chamber 6, and calculates the reflectivity of the semiconductor wafer W from Equation (7) using a value of the intensity Ilw and actual measured values of the edge radiation thermometer 20 and the center radiation thermometer 25 (Step S5).

Next, the heat treatment on the semiconductor wafer W is started (Step S6). Specifically, the 40 halogen lamps HL in the halogen heater 4 are simultaneously turned on to start preheating (assist-heating) the semiconductor wafer W. The halogen light emitted from the halogen lamps HL is transmitted through the bottom chamber window 64 and the susceptor 74 both made of quartz, and impinges upon the lower surface of the semiconductor wafer W. By receiving light emitted from the halogen lamps HL, the semiconductor wafer W is preheated, so that the temperature of the semiconductor wafer W is increased.

The edge radiation thermometer 20 measures the temperature of the semiconductor wafer W whose temperature is increased by the light emitted from the halogen lamps HL. Equation (8) below expresses a measurement value Ip4 output from the edge radiation thermometer 20 during the heat treatment on the semiconductor wafer W. Since the semiconductor wafer W is placed on the susceptor 74 during the heat treatment on the semiconductor wafer W, a component of light received by the edge radiation thermometer 20 is identical to that in Equation (4). Specifically, the edge radiation thermometer 20 receives not only the synchrotron radiation radiated from the semiconductor wafer W during the heat treatment, but also the transmitted light radiated from the top chamber window 63 and transmitted through the semiconductor wafer W and the reflected light radiated from the bottom chamber window 64 and reflected off the back surface of the semiconductor wafer W as ambient lights.

$$Ip4=Iw+(tw\cdot Iuw+rw\cdot Ilw) \ldots \quad (8)$$

Silicon (Si) that is a material of the semiconductor wafer W has properties in which a transmissivity decreases as the temperature is increased. When the temperature of the semiconductor wafer W is higher than or equal to 600° C., a transmissivity tw of the semiconductor wafer W is closer to 0. Thus, the transmitted light radiated from the top chamber window 63 and transmitted through the semiconductor wafer W in the ambient lights is negligible. Specifically, a main component of the ambient light received by the edge radiation thermometer 20 is the reflected light radiated from the bottom chamber window 64 and reflected off the back surface of the semiconductor wafer W. Consequently, Equation (9) below holds.

$$Iw=Ip4-rw\cdot Ilw \ldots \quad (9)$$

Specifically, the intensity Iw of the synchrotron radiation radiated from the semiconductor wafer W during the heat treatment is found as a value obtained by subtracting an intensity of the reflected light from the bottom chamber window 64 as the ambient light from the measurement value Ip4 of the edge radiation thermometer 20. The intensity of the reflected light radiated from the bottom chamber window 64 and reflected off the back surface of the semiconductor wafer W is a product of the reflectivity rw of the back surface of the semiconductor wafer W and the intensity Ilw of the synchrotron radiation radiated from the bottom chamber window 64. The reflectivity rw of the back surface of the semiconductor wafer W is found from Equation (7) in Step S5. The intensity Ilw of the synchrotron radiation radiated from the bottom chamber window 64 changes one after another by absorbing a part of the light emitted from the halogen lamps HL during the heat treatment on the semiconductor wafer W. In Embodiment 1, the controller 3 finds, from the mathematical model described above, the intensity Ilw of the synchrotron radiation which is radiated from the bottom chamber window 64 and which changes one after another.

The controller 3 substitutes, in the mathematical model, the lamp power of the halogen lamps HL that changes in time to estimate the intensity Ilw of the synchrotron radiation which is radiated from the bottom chamber window 64 and which changes one after another. Then, the controller 3 multiplies the found intensity Ilw by the reflectivity rw of the back surface of the semiconductor wafer W to calculate the intensity of the reflected light from the bottom chamber window 64 that is an ambient light (Step S7).

Next, the controller 3 subtracts, based on Equation (9), the intensity of the ambient light from the measurement value Ip4 of the edge radiation thermometer 20 to calculate the intensity Iw of the synchrotron radiation radiated from the semiconductor wafer W during the heat treatment. The intensity Iw calculated from Equation (9) is a true intensity of synchrotron radiation which is radiated from the semiconductor wafer W and from which the influence of the ambient light has been eliminated. The controller 3 performs a predetermined computation process on the intensity Iw of the synchrotron radiation calculated from Equation (9) to calculate the temperature of the semiconductor wafer W (Step S8). The controller 3 may store the calculated temperature of the semiconductor wafer W in a storage, and also display the temperature in a display part such as a liquid crystal display.

As the heat treatment proceeds, the temperature of the semiconductor wafer W changes with time. Furthermore, the temperature of the bottom chamber window 64 from which an ambient light originates also changes with time. Thus, the controller 3 repeatedly continues to calculate the temperature of the semiconductor wafer W until the heat treatment ends. Specifically, the controller 3 performs the processes in Steps S7 and S8 until the heat treatment on the semiconductor wafer W ends (Step S9).

The controller 3 controls the output from the halogen lamps HL while monitoring whether the temperature of the semiconductor wafer W, which will be increased by emission of light from the halogen lamps HL, reaches a predetermined preheating temperature T1. In other words, the controller 3 provides feedback control of the output from the halogen lamps HL so that the temperature of the semiconductor wafer W calculated in Step S8 is equal to the preheating temperature T1.

After the temperature of the semiconductor wafer W reaches the preheating temperature T1, the controller 3 tentatively maintains the semiconductor wafer W at the preheating temperature T1. Specifically, the controller 3 adjusts the output from the halogen lamps HL when the temperature of the semiconductor wafer W calculated in Step S8 reaches the preheating temperature T1, to maintain the temperature of the semiconductor wafer W almost at the preheating temperature T1.

By performing such preheating using the halogen lamps HL, the temperature of the entire semiconductor wafer W is uniformly increased to the preheating temperature T1. Since the temperature of the peripheral portion of the semiconductor wafer W from which heat is more easily dissipated tends to decrease more than that of the central portion thereof in the preheating phase using the halogen lamps HL, the halogen lamps HL in the halogen heater 4 are disposed at a higher density in a region facing the peripheral portion of the semiconductor wafer W than that in a region facing the central portion thereof. This allows a greater amount of light to impinge upon the peripheral portion of the semiconductor wafer W from which heat is easily dissipated, and allows the plane temperature distribution of the semiconductor wafer W in the preheating phase to be uniform.

The flash lamps FL in the flash heater 5 emit flashes of light to the front surface of the semiconductor wafer W held by the susceptor 74 after a lapse of a predetermined time period since the temperature of the semiconductor wafer W reaches the preheating temperature T1. A part of the flashes of light emitted from the flash lamps FL is directly directed into the chamber 6, and another part thereof is temporarily reflected by the reflector 52 and then directed into the chamber 6. These flashes of light initiate flash heating of the semiconductor wafer W.

Since the flash heating is performed with emission of flashes of light (flashes) from the flash lamps FL, the front surface temperature of the semiconductor wafer W can be increased in a short time period. In other words, the flashes of light emitted from the flash lamps FL are intense flashes whose emission time is very short and approximately ranges from 0.1 to 100 milliseconds and which are very short light pulses transformed from the electrostatic energy accumulated in advance in the capacitors. Then, the front surface temperature of the semiconductor wafer W subjected to the flash heating with emission of flashes of light from the flash lamps FL is instantaneously increased to the treatment temperature T2 higher than equal to 1000° C., and is then rapidly decreased.

After a lapse of a predetermined time period since the end of the flash heating treatment, the halogen lamps HL are turned off. This rapidly lowers the temperature of the semiconductor wafer W from the preheating temperature T1. After the temperature of the semiconductor wafer W is lowered to a predetermined temperature or below, the pair of transfer arms 11 of the transfer mechanism 10 is moved horizontally again from the retracted position to the transfer operation position and is then moved upward, so that the lift pins 12 protrude from the upper surface of the susceptor 74 to receive the heat-treated semiconductor wafer W from the susceptor 74. Subsequently, the transport opening 66 closed by the gate valve 185 is opened, and the transport robot outside the heat treatment apparatus 1 transports the semiconductor wafer W placed on the lift pins 12 out of the chamber 6. Thus, the heat treatment apparatus 1 completes the heat treatment of the semiconductor wafer W (Step S10).

In Embodiment 1, the controller 3 measures the reflectivity rw of the semiconductor wafer W transported into the chamber 6, and calculates the intensity of an ambient light received by the edge radiation thermometer 20, based on the reflectivity rw and the intensity Ilw of the synchrotron radiation radiated from the bottom chamber window 64. Then, the controller 3 subtracts the intensity of the ambient light from the intensity (measurement value Ip4) of the light received by of the edge radiation thermometer 20 during the heat treatment on the semiconductor wafer W to calculate the temperature of the semiconductor wafer W.

A method for measuring the reflectivity of the semiconductor wafer W in advance in another chamber (e.g., an alignment chamber that aligns the orientation of the semiconductor wafer W) using a dedicated reflectivity measurement mechanism before the semiconductor wafer W is transported into the chamber 6 is probably used. However, when an ambient environment in a chamber (e.g., an angle at which a radiation thermometer is set) differs, a reflectivity to be measured also differs. Since the controller 3 finds the reflectivity of the semiconductor wafer W in an environment identical to an actual heat treatment environment after the semiconductor wafer W is transported into the chamber 6 in Embodiment 1, the controller 3 can obtain a more correct reflectivity of the semiconductor wafer W in the actual heat treatment environment. This method can calculate the intensity of the ambient light received by the edge radiation thermometer 20 accurately and measure the temperature of the semiconductor wafer W with higher precision. Accurate measurement of the temperature of the semiconductor wafer W can, for example, increase the precision of controlling the temperature of the semiconductor wafer W in preheating the semiconductor wafer W.

Embodiment 1 formulates a mathematical model representing a relationship between the lamp power of the plurality of halogen lamps HL and the intensity Ilw of the synchrotron radiation radiated from the bottom chamber window 64, and finds, from the mathematical model, the intensity Ilw of the synchrotron radiation which is radiated from the bottom chamber window 64 and which changes one after another with an elapsed time. This method can measure the temperature of the semiconductor wafer W more accurately and calculate the intensity of the ambient light that changes one after another more appropriately.

Embodiment 2

Embodiment 2 according to the present disclosure will be described next. The intensity Ilw of the synchrotron radiation radiated from the bottom chamber window 64 is found from the mathematical model in Embodiment 1, whereas the intensity Ilw of the synchrotron radiation radiated from the bottom chamber window 64 is measured by actual measurements in Embodiment 2.

FIG. 12 is a longitudinal sectional view showing a structure of a heat treatment apparatus 1a according to Embodiment 2. In FIG. 12, the same reference numerals are attached to the same constituent elements as those in the heat treatment apparatus 1 according to Embodiment 1 (FIG. 1). The heat treatment apparatus 1a according to Embodiment 2 differs from that according to Embodiment 1 in including a lower window radiation thermometer 29. The lower window radiation thermometer 29 is disposed, for example, between the chamber 6 and the halogen heater 4. The lower window radiation thermometer 29 receives the synchrotron radiation radiated from the bottom chamber window 64, and measures the temperature of the bottom chamber window 64. The remaining constituent elements of the heat treatment apparatus 1a except the lower window radiation thermometer 29 are identical to those according to Embodiment 1.

Treatment operations of the heat treatment apparatus 1a according to Embodiment 2 are also almost identical to those according to Embodiment 1 (FIG. 8). However, when the controller 3 calculates the reflectivity rw of the semiconductor wafer W from Equation (7) in Step S5, an actual measured value of the lower window radiation thermometer 29 is used as the intensity Ilw of the synchrotron radiation radiated from the bottom chamber window 64 in Embodiment 2. In other words, the controller 3 calculates the reflectivity rw of the semiconductor wafer W from Equation (7) using actual measured values of the lower window radiation thermometer 29, the edge radiation thermometer 20, and the center radiation thermometer 25.

Furthermore, when the controller 3 calculates the intensity of the ambient light in Step S7, the actual measured value of the lower window radiation thermometer 29 is used as the intensity Ilw of the synchrotron radiation that is radiated from the bottom chamber window 64 and changes one after another in Embodiment 2. Then, the controller 3 multiplies the actual measured value of the lower window radiation thermometer 29 by the reflectivity rw of the back surface of the semiconductor wafer W to calculate the intensity of the reflected light from the bottom chamber window 64 that is an ambient light. Next, the controller 3 subtracts the intensity of the ambient light from the measurement value Ip4 of the edge radiation thermometer 20 to calculate the intensity Iw of the synchrotron radiation radiated from the semiconductor wafer W during the heat treatment, and calculates the temperature of the semiconductor wafer W.

In Embodiment 2, the intensity Ilw of the synchrotron radiation which is radiated from the bottom chamber window 64 and which changes one after another is determined, based on the actual measured value of the lower window radiation thermometer 29. Then, the controller 3 calculates the intensity of the ambient light received by the edge radiation thermometer 20, based on the intensity Ilw of the synchrotron radiation found in an actual measurement by a measuring instrument and the reflectivity rw of the semiconductor wafer W to calculate the temperature of the semiconductor wafer W during the heat treatment. Consequently, this method can accurately calculate the intensity of the ambient light which is received by the edge radiation thermometer 20 and which changes one after another, and measure the temperature of the semiconductor wafer W with higher precision.

Modifications

While Embodiments according to the present disclosure are described above, various modifications in addition to those described above can be made without departing from the scope and spirit of the disclosure. Although the controller 3 finds the intensity Ilw of the synchrotron radiation radiated from the bottom chamber window 64 and calculates the intensity of the reflected light from the bottom chamber window 64 as an ambient light received by the edge radiation thermometer 20 in Embodiments 1 and 2, the operations are not limited to these. Instead, an upper radiation thermometer may be disposed above the semiconductor wafer W. The light radiated from the top chamber window 63 and reflected off the front surface of the semiconductor wafer W may be handled as an ambient light to be received by the upper radiation thermometer. Here, the controller 3 finds the intensity of the synchrotron radiation radiated from the top chamber window 63, and calculates the intensity of an ambient light based on the found intensity and the reflectivity of the front surface of the semiconductor wafer W.

The transfer function is used as a mathematical model that estimates the intensity Ilw of the synchrotron radiation radiated from the bottom chamber window 64 in Embodiment 1. The mathematical model is not limited to this, but may be, for example, a state-space representation, Auto-Regressive with eXogenous (ARX) model, a nonlinear ARX Model, or a neural network. Specifically, the mathematical model should be any mathematical model that can output the intensity Ilw of the synchrotron radiation which is radiated from the bottom chamber window 64 and which changes one after another.

In Embodiment 2, the lower window radiation thermometer 29 actually measures the intensity Ilw of the synchrotron radiation radiated from the bottom chamber window 64. In addition, the controller 3 finds the intensity Ilw from a mathematical model as in Embodiment 1. When a difference between the intensity Ilw measured by the lower window radiation thermometer 29 and the intensity Ilw found from the mathematical model exceeds a preset threshold, the controller 3 may determine an anomaly and stops the heat treatment.

The technology according to the present disclosure may be applied to measuring the temperature of each of two or more semiconductor wafers W when the semiconductor wafers W are sequentially subjected to the heat treatment. The technology according to the present disclosure is suitable for measuring temperatures of the second and subsequent semiconductor wafers W when a plurality of semiconductor wafers W of one lot are transported sequentially one by one into the chamber 6 to be subjected to the heat treatment. This is because the intensity of an ambient light is increased due to an increase in the temperature of, for example, the bottom chamber window 64 when the second and subsequent semiconductor wafers W are treated.

Although the flash heater 5 includes the 30 flash lamps FL in Embodiments, the number of the flash lamps FL is not limited to this but can be any. Furthermore, the flash lamps FL are not limited to xenon flash lamps but may be krypton flash lamps. The number of the halogen lamps HL included in the halogen heater 4 is not limited to 40 but can be any.

The filament-type halogen lamps HL preheat the semiconductor wafer W as continuous lighting lamps that emit light continuously for not less than one second in Embodiments. The continuous lighting lamps that preheat the semiconductor wafer W are not limited to the halogen lamps HL but may be discharge-type arc lamps (e.g., xenon arc lamps) or LED lamps as a replacement for the halogen lamps HL.

While the invention has been shown and described in detail, the foregoing description is in all aspects illustrative and not restrictive. It is therefore understood that numerous modifications and variations can be devised without departing from the scope of the invention.

What is claimed is:

1. A method for measuring a temperature of a substrate to be heated by light emission, the method comprising the steps of:
   (a) measuring a reflectivity of the substrate transported into a chamber;
   (b) calculating an intensity of an ambient light received by a radiation thermometer, based on the reflectivity measured in step (a) and an intensity of synchrotron radiation radiated from a quartz window included in the chamber, the radiation thermometer measuring the temperature of the substrate;
   (c) subtracting the intensity of the ambient light from an intensity of light received by the radiation thermometer while the substrate is heated by the light emission to calculate the temperature of the substrate; and
   wherein step (a) includes calculating the reflectivity, based on determining an intensity of light received by the radiation thermometer when the substrate transported into the chamber is supported apart from a susceptor, an intensity of light received by the radiation thermometer when the substrate is placed on the susceptor, and an intensity of light radiated from the susceptor.

2. The method according to claim 1,
   wherein step (b) includes calculating the intensity of the ambient light, based on the intensity of the synchrotron radiation radiated from the quartz window that changes one after another while the substrate is heated by the light emission.

3. The method according to claim 2, wherein the intensity of the synchrotron radiation radiated from the quartz window is found from a measurement by a measuring instrument.

4. The method according to claim 2, wherein the intensity of the synchrotron radiation radiated from the quartz window is determined from a mathematical model.

* * * * *